United States Patent
Van Bezooijen et al.

(10) Patent No.: US 8,330,475 B2
(45) Date of Patent: Dec. 11, 2012

(54) CIRCUIT FOR DETECTING A MAGNITUDE AND PHASE OF AN IMPEDANCE OF A LOAD

(75) Inventors: Adrianus Van Bezooijen, Molenhoek (NL); Christophe Chanlo, Deil (NL)

(73) Assignee: EPCOS AG, Munich (DE)

( * ) Notice: Subject to any disclaimer, the term of this patent is extended or adjusted under 35 U.S.C. 154(b) by 1080 days.

(21) Appl. No.: 11/576,807

(22) PCT Filed: Sep. 29, 2005

(86) PCT No.: PCT/IB2005/053218
§ 371 (c)(1),
(2), (4) Date: Feb. 21, 2008

(87) PCT Pub. No.: WO2006/038167
PCT Pub. Date: Apr. 13, 2006

(65) Prior Publication Data
US 2008/0266021 A1 Oct. 30, 2008

(30) Foreign Application Priority Data
Oct. 6, 2004 (EP) .................................. 04104889

(51) Int. Cl.
*G01R 27/08* (2006.01)
*H03H 7/38* (2006.01)

(52) U.S. Cl. ........................................ 324/709; 333/32

(58) Field of Classification Search .................. 324/709
See application file for complete search history.

(56) References Cited

U.S. PATENT DOCUMENTS

| 3,825,825 | A | | 7/1974 | Smolka |
| 4,493,112 | A | | 1/1985 | Bruene et al. |
| 4,493,113 | A | | 1/1985 | Forrest et al. |
| 6,005,398 | A | | 12/1999 | Landt et al. |
| 6,020,795 | A | * | 2/2000 | Kim ................................ 333/33 |
| 6,407,550 | B1 | * | 6/2002 | Parakulam et al. ........... 324/326 |

(Continued)

FOREIGN PATENT DOCUMENTS

EP 0662753 A 7/1995

(Continued)

OTHER PUBLICATIONS

Yokoshima, I., "RF Impedance Measurements by Voltage-Current Detection," IEEE Transactions on Instrumentation and Measurement, Apr. 1993, pp. 524-527, vol. 42, No. 2.

*Primary Examiner* — Jeff Natalini
(74) *Attorney, Agent, or Firm* — Slater & Matsil, L.L.P.

(57) ABSTRACT

The invention relates to an antenna which is coupled to an RF amplifier. Environmental conditions change the impedance of the antenna, which reduces output power, efficiency and linearity. A circuit is provided which is designed to detect the impedance of the antenna. With the measured impedance, impedance matching can be accomplished. The circuit for detecting the impedance detects the signal travelling from the RF amplifier to the antenna, and measures the peak voltage and the peak current of this signal. Furthermore, the phase difference between the voltage and the current is measured. The advantage of the circuit is its compactness allowing for an easy integration on a chip. Furthermore, an impedance matching circuit is suggested which makes use of the above circuit for detecting the impedance.

19 Claims, 4 Drawing Sheets

U.S. PATENT DOCUMENTS

Figure 1:
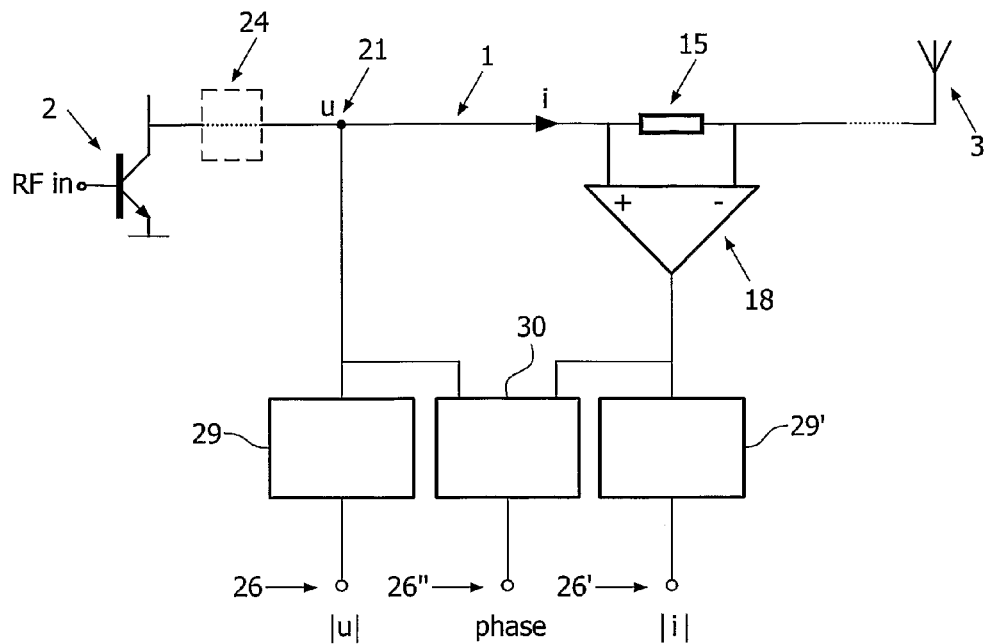

| | | | |
|---|---|---|---|
| 6,414,562 B1 | 7/2002 | Bouisse et al. | |
| 6,480,006 B1 * | 11/2002 | Buckley | 324/613 |
| 6,541,993 B2 * | 4/2003 | Laureanti | 324/765 |
| 7,548,741 B2 * | 6/2009 | Church | 455/280 |
| 2005/0061442 A1 * | 3/2005 | Higashiura | 156/345.44 |

FOREIGN PATENT DOCUMENTS

| | | |
|---|---|---|
| JP | 05-080093 A | 3/1993 |
| JP | 06-011528 A | 1/1994 |

* cited by examiner

CIRCUIT FOR DETECTING A MAGNITUDE AND PHASE OF AN IMPEDANCE OF A LOAD

The present invention relates, in general, to semiconductor circuits and, more particularly, to radio frequency (RF) circuits.

The performance of an RF power amplifier depends on the impedance of a load coupled to the output of the RF power amplifier. An RF power amplifier is generally designed to have an optimum performance when the load impedance has a predetermined value such as, for example, 50Ω. For reasons of convenience the RF power amplifier will be abbreviated RF amplifier. If the RF amplifier feeds an antenna, for example an antenna used in hand-held communication devices such as mobile phones and the like, environmental conditions may change the impedance of the antenna (load). The moving hand and head of the user, and other nearby objects, cause large disturbances in the antenna impedance. However, when the antenna impedance differs from the predetermined value, the performance, such as output power, efficiency, linearity, etc., of the power amplifier is degraded.

It is well known to place a circulator between the power amplifier and the antenna to account for the above mentioned problem. The circulator, has a first terminal coupled to the output of the power amplifier, a second terminal coupled to the antenna, and a third terminal coupled to ground via a device having a fixed impedance, e.g., 50Ω. The output signal of the power amplifier is transmitted to the antenna through the first and second terminals of the isolator. The signal reflected back from the antenna due to an impedance mismatch is transmitted to ground via the third terminal of the isolator and the fixed impedance device. Thus, the impedance mismatch of the antenna does not affect the performance of the power amplifier. However, an isolator is big, expensive, and power inefficient. It is not suitable for use in low cost, low power, portable communication systems.

I. Yokoshima: RF Impedance Measurements by Voltage-Current Detection, IEEE Transactions on Instrumentation and Measurement, Vol. 42, No. 2, April 1993, discloses a VHF-UHF impedance measurement technique by detecting the voltage and the current of a device under test. The voltage across this device is measured by means of a resistive divider, and the current is measured by means of a pick-up coil.

U.S. Pat. No. 4,493,113 depicts in its FIG. 1 a piece of prior art in which a circuit detects both the impedance Z and the phase Θ of an antenna, whereby the antenna is coupled to an RF amplifier. Voltage sensors and current sensors are used to determine the magnitude of the impedance Z.

It is an object of the invention to provide a circuit for detecting the magnitude and the phase of the impedance of a load, the load being connected or being connectable to an RF amplifier, and an impedance matching circuit, which both show a high accuracy, are simple in design, and provide a high level of integration.

This object is solved by the features of the independent claims. Further embodiments of the invention are described by the features of the dependent claims. It should be emphasized that any reference signs in the claims shall not be construed as limiting the scope of the invention.

According to the present invention the above mentioned problem is solved by a circuit for detecting the magnitude and the phase of the impedance of a load, whereby the load is connectable or is connected to an RF amplifier. The circuit has first means for sensing the peak value of the output voltage of the RF amplifier, and second means for sensing the peak value of the output current of the RF amplifier. In a first alternative, the first means and/or the second means comprise a mixer and an amplitude limiter. In a second alternative, first means and/or the second means comprise a peak diode detector. Furthermore, the circuit has third means for sensing or measuring a signal whose value depends on the phase between output voltage and output current, or has third means for deriving the phase between output voltage and output current by means of linear multiplication.

Furthermore, the problem is solved by an impedance matching circuit, comprising a radio frequency amplifier coupled to a load by means of a feed line, whereby the feed line comprises an adaptive output network. Furthermore, the impedance detector comprises a control unit to adjust the adaptive output network in response to the measured impedance, whereby the detector is an antenna mismatch detector as described in the last paragraph.

Both circuits are designed to operate in the radio frequency range, thus in the frequency range between about 10 kHz and about 10 GHz.

As far as the circuit for detecting the magnitude and the phase of the impedance is concerned, the idea of the solution is to use the energy flow from the RF amplifier to the antenna to determine the impedance and its phase. This energy flows in the feed line connecting the RF amplifier with the antenna. As the energy flow originates in the RF amplifier, the voltage associated with the signal mentioned above is called the output voltage of the RF amplifier. Correspondingly, the current flowing to the antenna is called the output current of the RF amplifier, as it is the current associated with the above mentioned signal. These two quantities are measured, and their phase difference as well.

If V is the detected output voltage, and I the detected output current, then the impedance Z is defined as $$Z = \frac{V}{I} = |Z| * \exp(i\varphi),$$

with $\varphi$ being the impedance phase. $\varphi$ is the phase difference between the output voltage, and the output current. The phase difference $\varphi$ can be any value between $-90°$ and $+90°$.

For a full information of Z, both the magnitude $|Z|$ and the phase $\varphi$ is needed. The magnitude of Z is given by the ratio of $|V|$ and $|I|$, which both can be measured by means of peak detection. The phase difference $\varphi$ can be detected by means of a phase detector. To be even more precise, the above mentioned approach yields the absolute values $|V|$ and $|I|$ and yields a signal representing the phase difference $\varphi$, for example $\sin(\varphi)$, between voltage and current.

The general solution described above is illustrated by means of the block diagram of FIG. 1, in which a source for radio frequency signals in the shape of a RF amplifier 2 is connected to an antenna 3 by means of a feed line 1. Peak detection means 29 serve to measure the voltage $|V|$ associated with the above energy flow, and second peak detection means 29' serve to measure $|I|$. Phase detection means 30 determine the phase information. The signals obtained are linearly multiplied. In other words, peak detection is performed by a linear multiplication of the signal with its own hard limited equivalent.

First means for sensing the peak value of the output voltage of the RF amplifier are used. This peak detector detects the output signal in a direct way by sensing a node voltage, whereby the node connects the first means with the feed line. The first means may comprise an amplitude limiter and a mixer. The input of the amplitude limiter is chosen to be the node voltage. The input signals of the mixer are the node voltage and the output signal of the amplitude limiter. In the alternative, the first means comprise a peak diode detector.

Second means for sensing the peak value of the output current of the RF amplifier are used. One possible embodiment of this peak detector for |I| would include a sense resistor placed in the feed line. The sense resistor then detects the voltage drop at this resistor when the energy flows from the RF amplifier to the antenna. As the voltage drop is proportional to the current flowing from the RF amplifier to the antenna, this branch current can be fed into an amplitude limiter and into a mixer to measure it. To do so, it is desirable to apply the voltage drop at the resistor to an operational amplifier, and to feed the output signal of this operational amplifier into the amplitude limiter and into the mixer. The input signals of the mixer are chosen to be the output signal of the amplitude limiter, and the signal originating from the operational amplifier as mentioned above. In the alternative, the second means comprise a peak diode detector.

In addition, third means for sensing/measuring the phase difference between the output voltage of the RF amplifier, and the output current of the RF amplifier are used. This phase detector may comprise a phase shifter, preferably a +/−90° phase shifter and a mixer. The input of the phase shifter is connected to a node, the node being part of the feed line. The amplifier, the node and the third means can be connected in series. The first input of the mixer is chosen to be the output of the amplitude limiter, and the second input is the output of the amplitude limiter which forms part of the first means.

In the alternative, the third means may be adapted to derive the phase between output voltage and output current by means of linear multiplication. In this case the output of a detector is chosen to be proportional to the magnitude of the voltage, to be proportional to the magnitude of the current, and to be proportional to $\sin(\phi)$. The phase can be extracted from the signal by post processing.

Instead of choosing a sense resistor in the feed line a coil or a capacitor can be used instead. This has the advantage that the third means need not comprise a 90° phase shifter, such that this solution needs one part less. In the case of multi-band applications, such as mobile phones operating both in the GSM and the UMTS frequency bands, the 90 degrees phase shifter is a wide-band phase shifter. In the alternative, a high-Q coil (or capacitor) provides this 90 degrees phase shift between the current through it and voltage across it over a very wide frequency range.

As described above, measured peak values of the output voltage and the output current allow for calculating the impedance. For this purpose the circuit may have means for dividing the output voltage by the output current. Dividing means may be implemented in either in the analogue or digital domain in ways, which are well known for the man skilled in the art. They may be ASIC's, EPROM's, CPU's and the like. However, it is also possible that the circuit for detecting the impedance doesn't comprise dividing means, but that the dividing means are provided by a control unit which forms part of the impedance matching circuit according to the present invention.

The impedance matching circuit according to the present invention allows the user to decide whether the detector senses the antenna impedance (in this case the node is located between the adjustable output matching network and the load), or senses the input impedance of the adjustable output matching network (in this case the node is located between the RF amplifier and the adjustable output matching network).

In another embodiment the RF amplifier comprises an array of at least two transistors. One transistor is connected to the output terminal of the RF amplifier. In this case the first means can be arranged to sense the collector voltage of this transistor which is coupled to the output terminal of the RF amplifier, and the second means can be arranged to sense the corresponding collector current. In an alternative to the last mentioned embodiment, one may decide not to sense the transistor current and the transistor voltage, but instead the emitter current and the collector voltage.

The advantage of both the impedance detector and the impedance matching circuit is its particularly small size which allows for an easier integration on a chip.

These and other aspects of the invention will be apparent from and elucidated with reference to the embodiments described thereafter.

Figure 2:
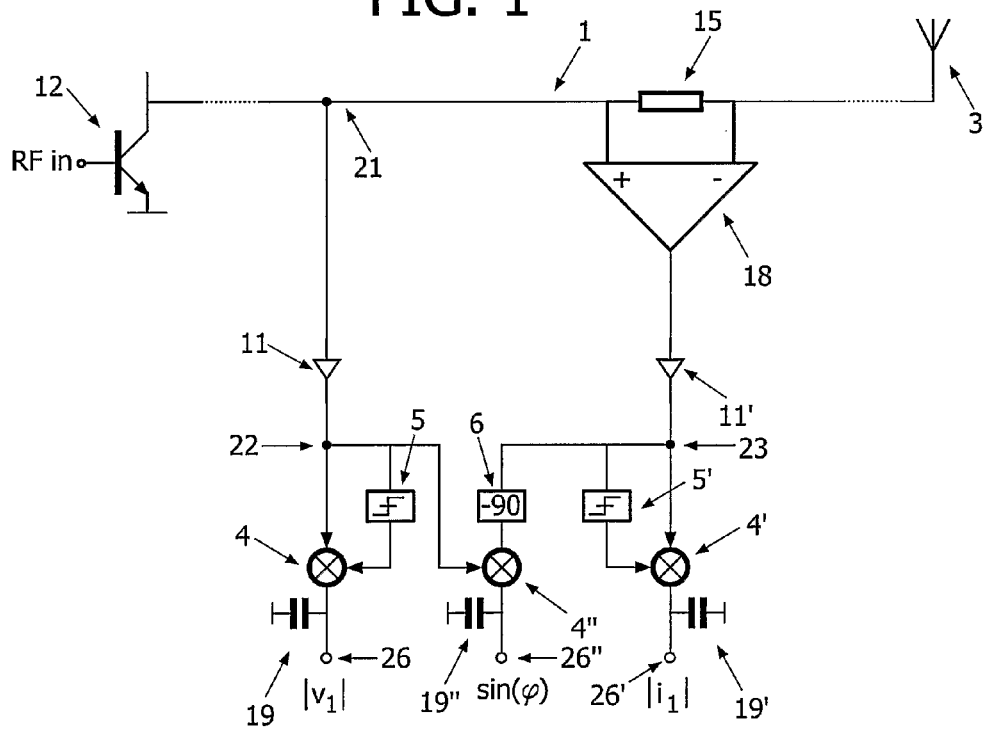
Figure 3:
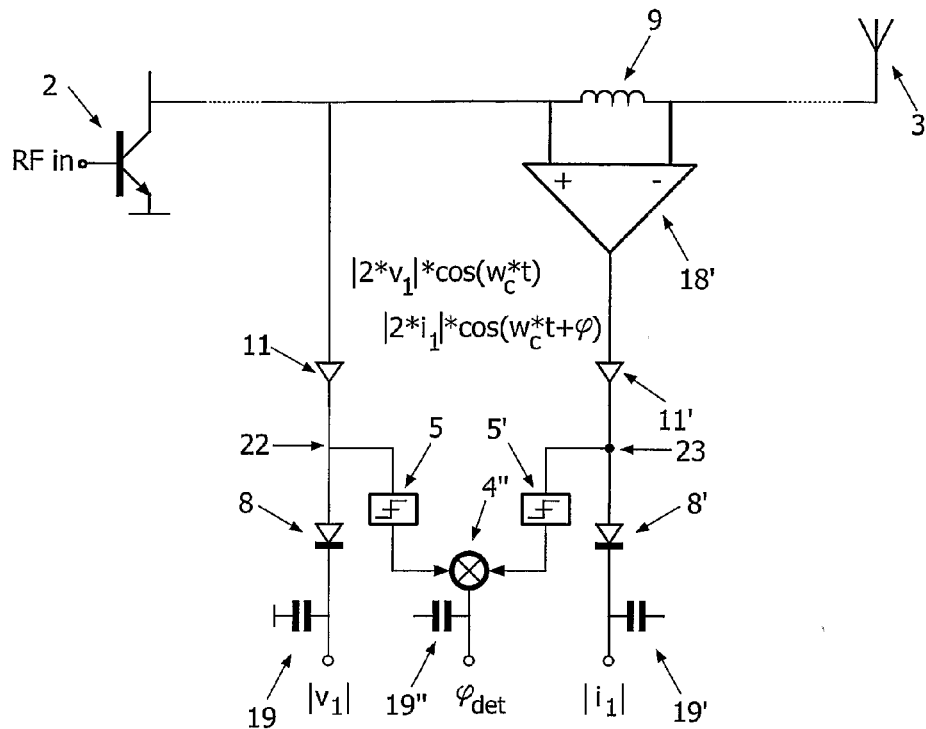
Figure 4:
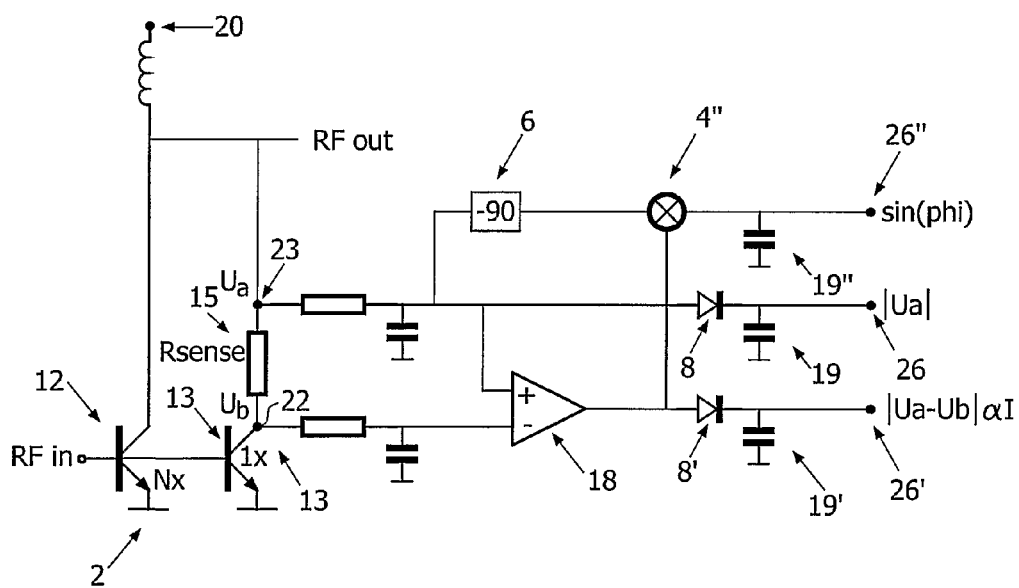
Figure 5:
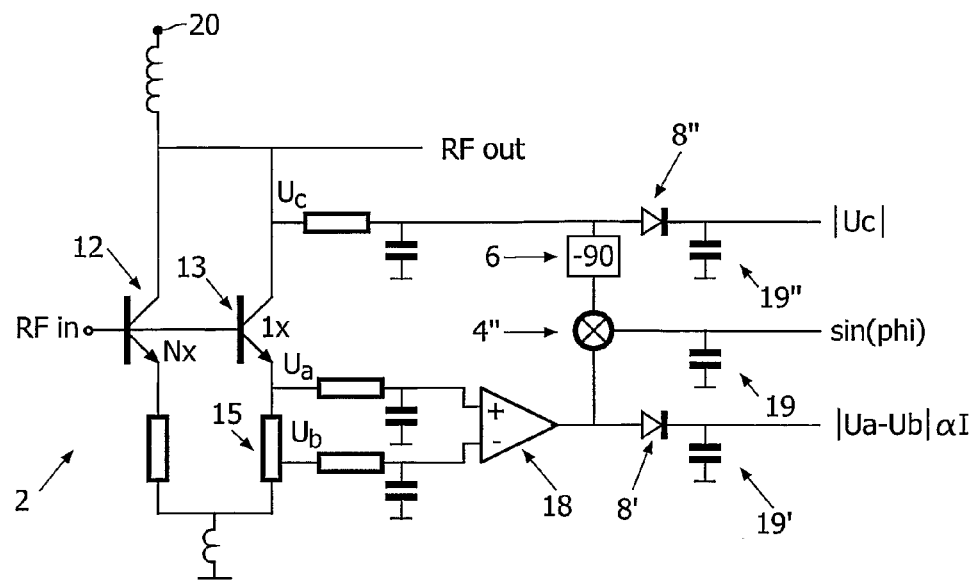
Figure 6:
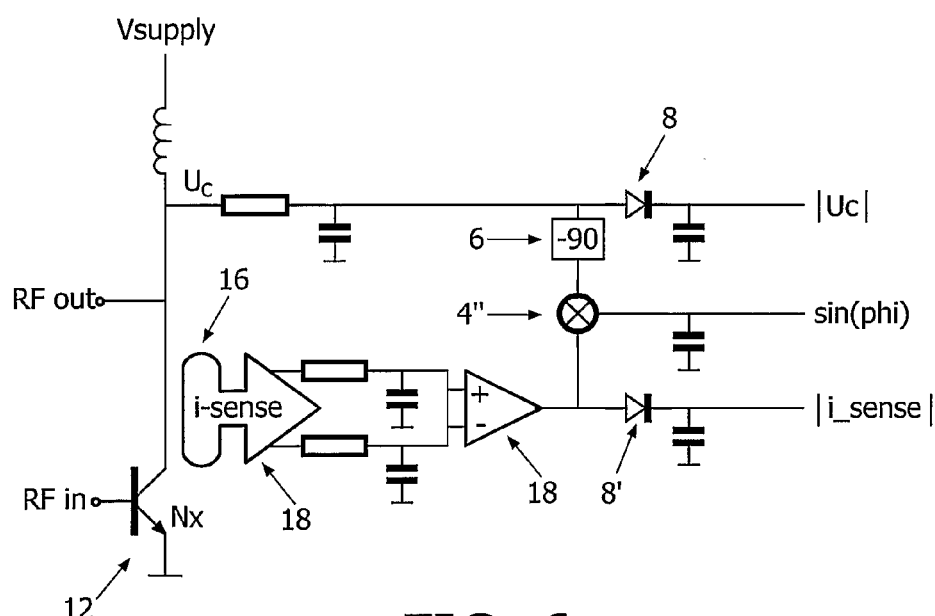
Figure 7:
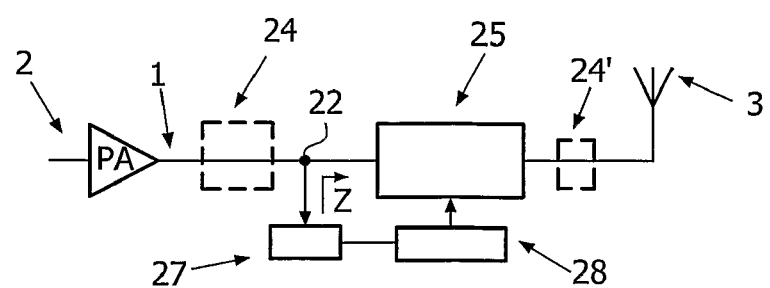
Figure 8:
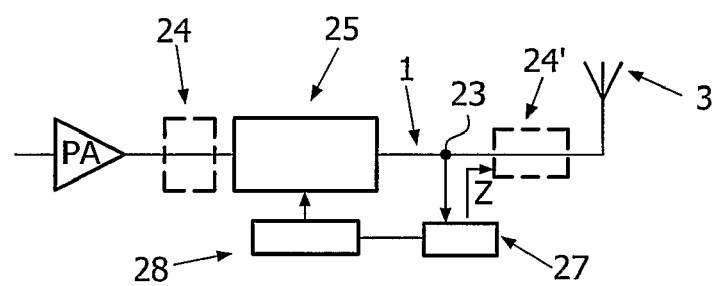

FIG. 1 shows the general solution in a generic block diagram,

FIG. 2 shows a first embodiment of the circuit for detecting the magnitude and the phase of the impedance of a load, FIG. 3 shows a second embodiment of the circuit, FIG. 4 shows a third embodiment of the circuit, FIG. 5 shows a fourth embodiment of the circuit, FIG. 6 shows a fifth embodiment of the circuit, FIG. 7 shows a block diagram of a first embodiment of the impedance matching circuit, FIG. 8 shows a block diagram of a second embodiment of the impedance matching circuit.

FIG. 2 shows a circuit for detecting the impedance of a load, which will also be called an impedance detector. The impedance detector has an RF amplifier 2 which is connected to an antenna 3 (load) by means of a feed line 1.

First means for sensing the peak value of the output voltage of the RF amplifier 2 are connected by node 21 to feed line 1. The first means comprise a mixer 4 and an amplitude limiter 5. The input signal of the amplitude limiter 5 is the node voltage at node 22. One input terminal of mixer 4 is connected to the feed line 1 by means of node 21, and the second input terminal is connected to the output terminal of amplitude limiter 5. Output terminal 26 yields the output signal |V|.

It is desirable to use a buffer amplifier 11 to provide an electric isolation between the RF amplifier and the first means. Furthermore, the mixer 4 may be connected to a grounded capacitor 19 which serves as a low pass filter for unwanted RF components.

The feed line 1 of the first embodiment comprises a sense resistor 15. The voltage drop at resistor 15 is fed into an operational amplifier 18, whose output signal is proportional to the current flowing in the feed line 1, and thus to the output current of the RF amplifier 2. The peak value of this current is sensed by the second means which comprise an amplitude limiter 5' and a mixer 4'. These components are connected in the same way as their counterparts forming part of the first means. Mixer 4' thus outputs a signal |I| at output terminal 26'.

The second means may be isolated from the feed line 1 by a buffer amplifier 11'. As in the case of the first means, an additional capacitor 19' being connected to the mixer 4' may serve as a low pass filter for filtering unwanted RF components.

Third means for detecting the phase include a −90° phase shifter 6 and a mixer 4" connected in series. Phase shifter 6 is connected to node 23, and thus to the branch measuring the output current. One input signal of mixer 4" is the output signal of the phase shifter 6, a second input terminal is connected via node 22 to the branch measuring the output voltage. The output at terminal 26" senses the phase difference between the voltage at terminal 26 and the current at terminal 26'.

The whole circuit can, if desired, be placed far away from the RF amplifier. This makes it possible to place a fixed output matching network 24 between the RF amplifier 2 and the load 3.

FIG. 3 shows a second embodiment of the impedance detector, whereby the same reference numerals denote the same parts as in the whole description. In comparison to FIG. 2, the sense resistor 15 is replaced by a sense coil 9. In the alternative, a sense capacitor 10 can replace the sense resistor 15. In the latter case, the replacement renders the phase shifter 6 of FIG. 2 superfluous. The coil 9, or the capacitor 10, can be chosen to be a part of an impedance matching network, which may be a fixed output network, an adaptive output network, or a combination of both.

In this embodiment, the first means and the second means do not comprise an amplitude limiter and a mixer, but instead peak diode detectors 8 and 8'. In order to determine the phase difference between the output current sensed at node 23, and the output voltage sensed at node 22, a mixer 4" is used. One input terminal of mixer 4" is connected to the output of amplitude limiter 5, which in turn is connected to node 22. The second input terminal of mixer 4" is connected to the output of a second amplitude limiter 5', which in turn is connected to node 23. In total, the second embodiment uses slightly less components in comparison to the first embodiment, which leads to a smaller size and thus makes an on-chip integration easier.

The fourth and the fifth embodiment, which will be discussed below, take situations into account, in which the RF amplifier comprises an array of at least two transistors. One of these transistors has a direct connection to the output terminal of the RF amplifier. In these situations either the collector current and the collector voltage of this transistor, or the emitter current and the collector voltage of this transistor can be measured. These two solutions make it possible to place the detecting circuit very close to the RF amplifier, which in turn leads to a particularly miniaturized design of a RF amplifier with a detecting circuit.

In the fourth embodiment shown in FIG. 4 the RF amplifier 2 comprises the above mentioned array 12 of at least two transistors. One transistor 13 is directly coupled to the output of the RF amplifier. This transistor 13 has a collector, and the collector current and the collector voltage are measured by the impedance detector.

The collector of the transistor 13 is connected to a sense resistor 15, through which the transistor current flows, and along which the voltage drops from a value $U_b$ at node 22 to a value $U_a$ at node 23. The resistor can be chosen to be a resistor placed in one of the collector contacts of the transistor array 12 as seen in FIG. 4, or can be a parasitic resistance in the collector interconnect (not shown). The sense resistor increases the sensitivity of the circuit.

First means are provided for sensing the peak value of the absolute value $|U_a|$ of the collector voltage of this transistor 13. The first means include a peak diode detector 8, which is connected to node 23 and to output terminal 26 which is outputting $|U_a|$.

Second means for sensing the peak value of the output current of the transistor 13 are also provided. They include an operational amplifier 18 connected to nodes 22 and 23 respectively, and a phase diode resistor 8'. Output terminal 26' thus outputs the voltage drop $|U_a-U_b|$ at the sense resistor 15 being proportional to $|I|$.

Third means for sensing the phase between the collector current and the collector voltage are provided and include phase shifter 6, which might be chosen to be a 90° phase shifter, and a mixer 4" connected in series, whereby the output of the mixer 4" is connected to output terminal 26" for outputting sin(φ).

Similar to the first three embodiments, the embodiment of FIG. 4 may have first means and second means which comprise low pass filters 19, 19', 19" cope with unwanted RF components.

In the fifth embodiment shown in FIG. 5, the power amplifier 2 has an array 12 of transistors, whereby one of these transistors, namely transistor 13, is connected to the output terminal of the power amplifier 2. The circuit is designed to measure the collector voltage $U_a$ and the emitter current of transistor 13. This approach is based on the approximation that the emitter current is approximately the same as the collector current. The approximation is accurate over a wide output power range but not any more once the power transistor goes into deep saturation. It uses the thermally stabilizing emitter ballast resistor 15 as a sense resistor. An extra sense resistor is rendered superfluous in this way. In addition, collector voltage saturation due to the extra sense resistor is avoided.

To detect the emitter current, the current flows through the ballast resistor 15. This allows measuring the corresponding voltage drop $|U_a-U_b|$ with a peak diode detectors 8' and an operational amplifier 18. The first means to detect the collector voltage $|U_c|$ comprise a peak diode detector 8".

The phase information, is sensed in a similar fashion as in the previous embodiments by means of a mixer 4" and a phase shifter 6. The phase shifter 6 of this embodiment is chosen to be a −90° phase shifter. Again, low pass filters 19, 19' and 19" can be added.

The embodiment of FIG. 6 shows a circuit almost identical to the circuit of FIG. 5, with the difference that the circuit comprises a pick-up coil 16 instead of a sense resistor 15 to detect the collector current.

FIGS. 7 and 8 show how the impedance detector as described above can be used as a part of an impedance matching circuit. In FIG. 7 the power amplifier 2 feeds the antenna 3 by means of feed line 1. In practice, a tuning to an optimum load line for the power amplifier is performed. In the arrangement of FIG. 7, the impedance detector 27 according to the present invention is arranged to sense the impedance at node 22, and thus to sense the matched impedance. In other words impedance detector 27 measures the impedance in the energy flow direction from left to right in (or from the power amplifier 2 to the antenna 3 in the direction of the z-arrow) from node 22 onward. In this respect FIG. 7 shows a feedback system. A control unit 28 provides the logic to compare the matched impedance with reference value representing the nominal load line impedance and to adjust the output of the adaptive output network accordingly. If desired, one or two optional fixed output networks 24, 24' can be added.

In FIG. 8 the impedance detector 27 according to the present invention is placed between the adaptive output network 25 and antenna 3 at node 23. In this case the detector 27 senses the antenna impedance, and not the matched impedance. The reason is, that the detector measures the impedance in the energy flow direction from left to right (or from the power amplifier 2 to the antenna 3 in the direction of the z-arrow) from node 23 onward. In this respect FIG. 7 shows a feed forward system.

List Of Reference Numerals 01 feed line
02 RF amplifier
03 antenna 04 mixer
04' mixer
04" mixer
05 amplitude limiter
05' amplitude limiter
05" amplitude limiter
06 phase shifter
07 dividing means
08 peak diode detector
09 sense coil
10 sense capacitor
11 buffer amplifier
11' buffer amplifier
12 array of transistor
13 transistor
14 collector
15 sense resistor
16 pick-up coil
17 detector
18 operational amplifier
19 capacitor
20 battery supply
21 node
22 node
23 node
24 fixed output network
25 adaptive output network
26 output terminal
26' output terminal
26" output terminal
27 impedance detector
28 control unit
29 peak detection means
30 phase detection means

The invention claimed is:

1. Circuit for detecting a magnitude and a phase of an impedance of a load, the load being connectable to a radio frequency (RF) amplifier by means of a feed line, the circuit comprising:
   a) first means for sensing a peak value of an output voltage of the RF amplifier, the first means being connected by a node to the feed line;
   b) second means for sensing a peak value of an output current of the RF amplifier, the second means comprising a peak sensor element placed in the feed line and being circuited in series between the RF amplifier and the load, wherein the peak sensor element is a resistor, a capacitor or a coil; and
   c) third means for
      c1) measuring a signal whose value depends on the phase between output voltage and output current, or
      c2) deriving the phase between output voltage and output current using linear multiplication;
   d) whereby the first means and/or the second means for peak value sensing comprise, in a branch coupled to the feed line,
      d1) a mixer and an amplitude limiter or
      d2) a peak diode detector;
   e) wherein an energy flow from the RF amplifier to the load through the feed line is used for detecting the impedance and phase.

2. Circuit according to claim 1, whereby the third means comprise a phase shifter and a mixer.

3. Circuit according to claim 1, whereby the feed line comprises either an inductance or a capacitance and whereby the third means comprise two amplitude limiters and a mixer.

4. Circuit according to claim 1, whereby the first means and the second means comprise buffer amplifiers.

5. Circuit according to claim 1, whereby the RF amplifier comprises an array of at least two transistors, whereby the first means arranged to sense a collector voltage of one of the transistors and whereby the second means is arranged to sense a corresponding collector current.

6. Circuit according to claim 1,
   whereby a transistor is directly coupled to the output of the RF amplifier,
   whereby the transistor comprises a collector, and
   whereby a load line of the collector comprises a sense resistor.

7. Circuit according to claim 1, whereby the RF amplifier comprises an array of at least two transistors, whereby the first means is arranged to sense a collector voltage of one of the transistors and whereby the second means is arranged to sense a corresponding emitter current.

8. Circuit according to claim 1, whereby the second means comprises a pick-up coil arranged to sense a collector current of a transistor that is part of the RF amplifier.

9. Impedance matching circuit for matching the impedance of a load to the impedance of a RF amplifier, whereby the load is connectable to the RF amplifier by means of a feed line, the impedance matching circuit comprising:
   an adaptive output network connected in between the RF amplifier and the load,
   an impedance detector coupled to a node of the feed line, wherein an energy flow from the RF amplifier to the load through the feed line is used for detecting the impedance and phase of the load, and
   a control unit to adjust the adaptive matching circuit in response to a measured impedance,
   wherein the impedance detector comprises:
   a) first means for sensing a peak value of an output voltage of the RF amplifier, the first means being connected by the node,
   b) second means for sensing a peak value of an output current of the RF amplifier, the second means comprising a peak sensor element placed in the feed line and being circuited in series between the RF amplifier and the load, wherein the peak sensor element is one of a resistor, a capacitor, and a coil, and
   c) third means for
      c1) measuring a signal whose value depends on the phase between output voltage and output current, or
      c2) deriving the phase between output voltage and output current by means of linear multiplication
   d) whereby the first means and/or the second means comprise, in a branch coupled to the feed line,
      d1) a mixer and an amplitude limiter or
      d2) a peak diode detector.

10. Impedance matching circuit according to claim 9, whereby the node is located between the RF amplifier and the adaptive output network.

11. Impedance matching circuit according to claim 10, whereby the node is located between the adaptive output network and the load.

12. A circuit comprising:
   a voltage sensor configured to sense a peak value of an output voltage of a radio frequency (RF) amplifier, the RF amplifier being connectable to a load by a feed line, the voltage sensor being connected by a node to the feed line;
   a current sensor configured to sense a peak value of an output current of the RF amplifier, the current sensor comprising a peak sensor element placed in the feed line in series between the RF amplifier and the load, wherein the peak sensor element is a resistor, a capacitor, or a coil, wherein the voltage sensor and/or the current sensor comprise, in a branch coupled to the feed line, a mixer and an amplitude limiter or a peak diode detector; and a circuit element configured to measure a signal whose value depends on a phase between output voltage and output current, or configured to derive the phase between output voltage and output current by linear multiplication, wherein an energy flow from the RF amplifier to the load through the feed line is used for detecting an impedance and phase of the load.

13. The circuit according to claim 12, wherein the circuit element comprises a phase shifter and a mixer.

14. The circuit according to claim 12, wherein the feed line comprises either an inductance or a capacitance and wherein the circuit element comprises two amplitude limiters and a mixer.

15. The circuit according to claim 12, wherein the voltage sensor and the current sensor comprise buffer amplifiers.

16. The circuit according to claim 12, wherein the RF amplifier comprises an array of at least two transistors, wherein the voltage sensor is arranged to sense a collector voltage of one of the transistors and wherein the current sensor is arranged to sense a corresponding collector current.

17. The circuit according to claim 12, wherein a transistor is directly coupled to the output of the RF amplifier, the transistor comprising a collector, wherein a load line of the collector comprises a sense resistor.

18. The circuit according to claim 12, wherein the RF amplifier comprises an array of at least two transistors, wherein the voltage sensor is arranged to sense a collector voltage of one of the transistors and whereby the current sensor is arranged to sense a corresponding emitter current.

19. The circuit according to claim 12, wherein the current sensor comprises a pick-up coil arranged to sense a collector current of a transistor that is part of the RF amplifier.

* * * * *